United States Patent
Chen et al.

(10) Patent No.: US 6,602,775 B1
(45) Date of Patent: Aug. 5, 2003

(54) METHOD TO IMPROVE RELIABILITY FOR FLIP-CHIP DEVICE FOR LIMITING PAD DESIGN

(75) Inventors: Yen-Ming Chen, Hsin Chu (TW); Chia-Fu Lin, Hsin-Chu (TW); Kai-Ming Ching, Taiping (TW); Hsin-Hui Lee, Koashiung (TW); Chao-Yuan Su, Koashiung (TW); Li-Chi Chen, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/930,677

(22) Filed: Aug. 16, 2001

(51) Int. Cl.⁷ ............................................. H01L 21/44
(52) U.S. Cl. ...................... 438/612; 438/108; 438/613
(58) Field of Search ............................... 438/612, 613, 438/108

(56) References Cited

U.S. PATENT DOCUMENTS

| | | | |
|---|---|---|---|
| 5,492,235 A | * 2/1996 | Crafts et al. | 216/100 |
| 5,496,770 A | * 3/1996 | Park | 216/47 |
| 5,616,517 A | * 4/1997 | Wen et al. | 430/312 |
| 5,736,456 A | 4/1998 | Akram | 438/614 |
| 5,773,897 A | * 6/1998 | Wen et al. | 257/724 |
| 5,874,199 A | * 2/1999 | Deligianni et al. | 430/312 |
| 5,903,058 A | 5/1999 | Akram | 257/778 |
| 5,918,144 A | * 6/1999 | Yanagida | 438/612 |
| 6,015,652 A | 1/2000 | Ahlquist et al. | 430/315 |
| 6,130,141 A | 10/2000 | Degani et al. | 438/455 |
| 6,211,052 B1 | 4/2001 | Farnworth | 438/614 |

* cited by examiner

Primary Examiner—Amir Zarabian
Assistant Examiner—Jeff Vockrodt
(74) Attorney, Agent, or Firm—George O. Saile; Stephen B. Ackerman; Stephen G. Stanton

(57) ABSTRACT

A method of fabricating a solder bump including the following steps. A UBM over a substrate having an exposed pad portion is provided. The UBM being in electrical contact with the pad portion. A first patterning layer is formed over the UBM. The first patterning layer including a photosensitive material sensitive to light having a first wavelength. A second patterning layer is formed over the first patterning layer. The second patterning layer including a photosensitive material sensitive to light having a second wavelength. The first patterning layer is selectively exposed with the light having the first wavelength, leaving a first unexposed portion substantially centered over the pad portion between first exposed portions. The second patterning layer is selectively exposed with the light having the second wavelength, leaving a second unexposed portion wider than, and substantially centered over, the first unexposed portion of the exposed first patterning layer. The second unexposed portion of the exposed second patterning layer being between exposed portions. The second unexposed portion of the exposed second patterning layer and the first unexposed portion of the exposed first patterning layer are removed to form opening. A solder plug is formed within the opening. The exposed portions of the exposed first patterning layer and the exposed portions of the exposed second patterning layer are removed. The solder plug is reflowed to form a solder bump.

25 Claims, 4 Drawing Sheets

METHOD TO IMPROVE RELIABILITY FOR FLIP-CHIP DEVICE FOR LIMITING PAD DESIGN

BACKGROUND OF THE INVENTION

Bump height is very critical in semiconductor flip-chip packages. Under bump metal (UBM) size is directly related to bump height. However, for high density chip designs, the UBM size is limited by the pad size. The bump height will be limited by the UBM size in straight wall photoresist (PR) technology. A mushroom shaped bump height is one alternative method to improve the bump height without increasing the UBM size, however mushroom bump height control is not easy.

U.S. Pat. No. 6,211,052 to Farnworth describes a UBM process using photoresist, specifically Farnworth discloses a method for forming a UBM pad and solder bump connection for a flip-chip which eliminates at least two mask steps required in standard UBM pad forming processes when repatterning the bond pad locations.

U.S. Pat. No. 6,130,141 to Degani et al. describes techniques for applying UBM for solder bump interconnections on integrated circuit (IC) chips with aluminum (Al) bonding sites.

U.S. Pat. No. 6,015,652 to Ahlquist et al. describes a lift-off process for applying UBM for solder bump interconnections on interconnection substrates.

U.S. Pat. Nos. 5,903,058 and 5,736,456 both to Akram describe a method for forming UBM pads and solder bump connections for a flip-chip which eliminates at least one mask step required in standard UBM pad forming processes.

SUMMARY OF THE INVENTION

Accordingly, it is an object of an embodiment of the present invention to provide an improved method of fabricating bumps.

Other objects will appear hereinafter.

It has now been discovered that the above and other objects of the present invention may be accomplished in the following manner. Specifically, a UBM over a substrate having an exposed pad portion is provided. The UBM being in electrical contact with the pad portion. A first patterning layer is formed over the UBM. The first patterning layer being comprised of a photosensitive material sensitive to light having a first wavelength. A second patterning layer is formed over the first patterning layer. The second patterning layer being comprised of a photosensitive material sensitive to light having a second wavelength. The first patterning layer is selectively exposed with the light having the first wavelength, leaving a first unexposed portion substantially centered over the pad portion between first exposed portions. The second patterning layer is selectively exposed with the light having the second wavelength, leaving a second unexposed portion wider than, and substantially centered over, the first unexposed portion of the exposed first patterning layer. The second unexposed portion of the exposed second patterning layer being between exposed portions. The second unexposed portion of the exposed second patterning layer and the first unexposed portion of the exposed first patterning layer are removed to form opening. A solder plug is formed within the opening. The exposed portions of the exposed first patterning layer and the exposed portions of the exposed second patterning layer are removed. The solder plug is reflowed to form a solder bump.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

Synopsis of the Invention

The method of the present invention includes creating a dual straight wall using two different kinds of patterning layers that are each sensitive to two different wavelengths of light $\lambda 1$ and $\lambda 2$, respectively, to increase bump height without changing the UBM size. The bumps so formed are generally used in flip-chip devices for limiting pad designs, i.e. the pad design is limited because the UBM size can not be larger than the pad size, although they are not necessarily so limited to flip-chip devices.

Initial Structure

Figure 1:
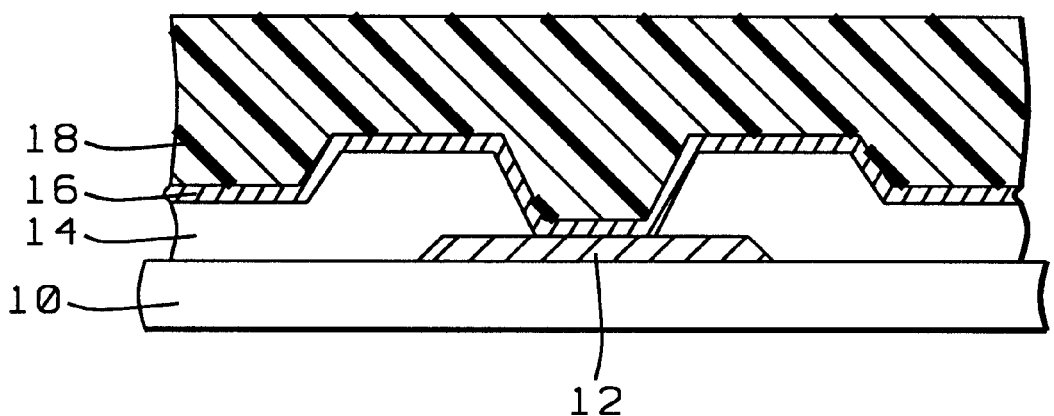
FIGS. 1 to 8 schematically illustrate a preferred embodiment of the present invention.

Accordingly, as shown in FIG. 1, structure 10 is understood to possibly include a semiconductor wafer or substrate, active and passive devices formed within the wafer, conductive layers and dielectric layers (e.g., interpoly oxide (IPO), intermetal dielectric (IMD), etc.) formed over the wafer surface. The term "semiconductor structure" is meant to include devices formed within a semiconductor wafer and the layers overlying the wafer.

Final pad metal portion 12 is formed over structure 10 and is electrically connected to one or more semiconductor devices (not shown) formed within structure 10. Passivation dielectric layer 14 is formed over final pad metal portion 12 and structure 10, is patterned to expose a portion of final pad metal portion 12 and under bump metal (UBM) 16 is formed over patterned passivation layer 14 and over the exposed portion of final pad metal portion 12.

Final pad metal portion 12 is preferably formed of Cu or AlCu. Passivation layer 14 is preferably formed of SiN, $SiO_2$, $SiN/SiO_2$ polyimide or BCB and is more preferably formed of $SiN/SiO_2$. UBM 16 is preferably a stack of metal layers formed of Ti/Cu, Cr/Cu, Al/Ni/V or Ti/Ni and is more preferably a stack of metal layers formed of Ti/Cu.

Formation of First Patterning Layer 18

As shown in FIG. 1, first patterning layer 18 is then formed over the structure to a thickness of preferably from about 1 to 50 $\mu$m and more preferably from about 5 to 10 $\mu$m.

In one key step of the invention, first patterning layer 18 is sensitive to light having a first wavelength ($\lambda 1$). First patterning layer 18 is preferably formed of a dry film resist or spin coated photoresist, and more preferably formed of a negative spin coated photoresist.

Formation of Second Patterning Layer 20

Figure 2:
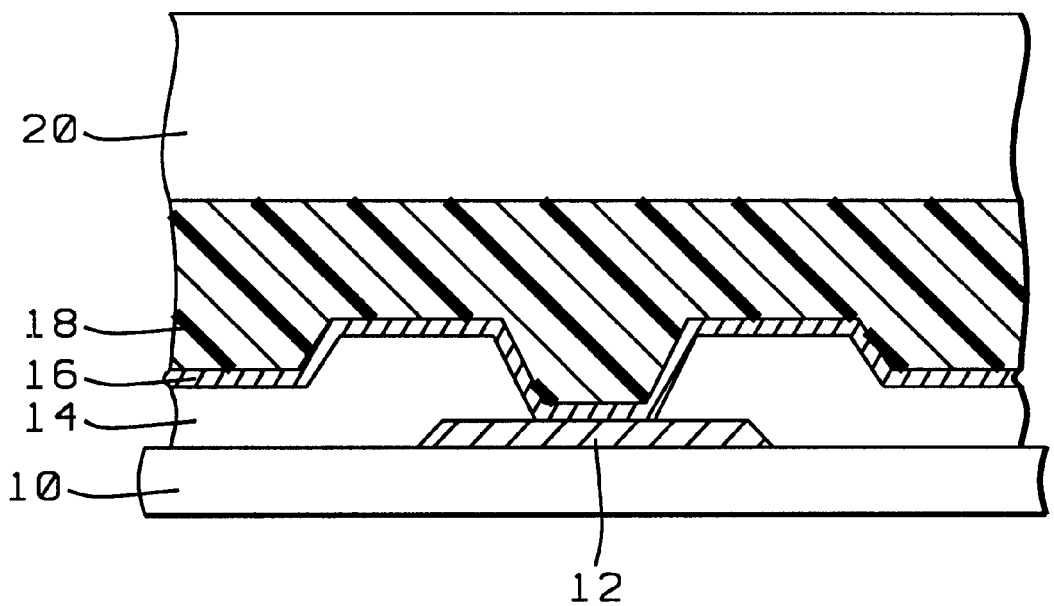

As shown in FIG. 2, second patterning layer 20 is then formed over first patterning layer 18 to a thickness of preferably from about 20 to 150 $\mu$m and more preferably from about 100 to 120 μm. In one key step of the invention, second patterning layer 20 is sensitive to light having a second wavelength (λ2) that is not the same as λ1.

Second patterning layer 20 is preferably either a negative spin coated photoresist or a negative photosensitive dry film and is more preferably a negative spin coated photoresist.

Selective Exposure of First Patterning Layer 18

Figure 3:
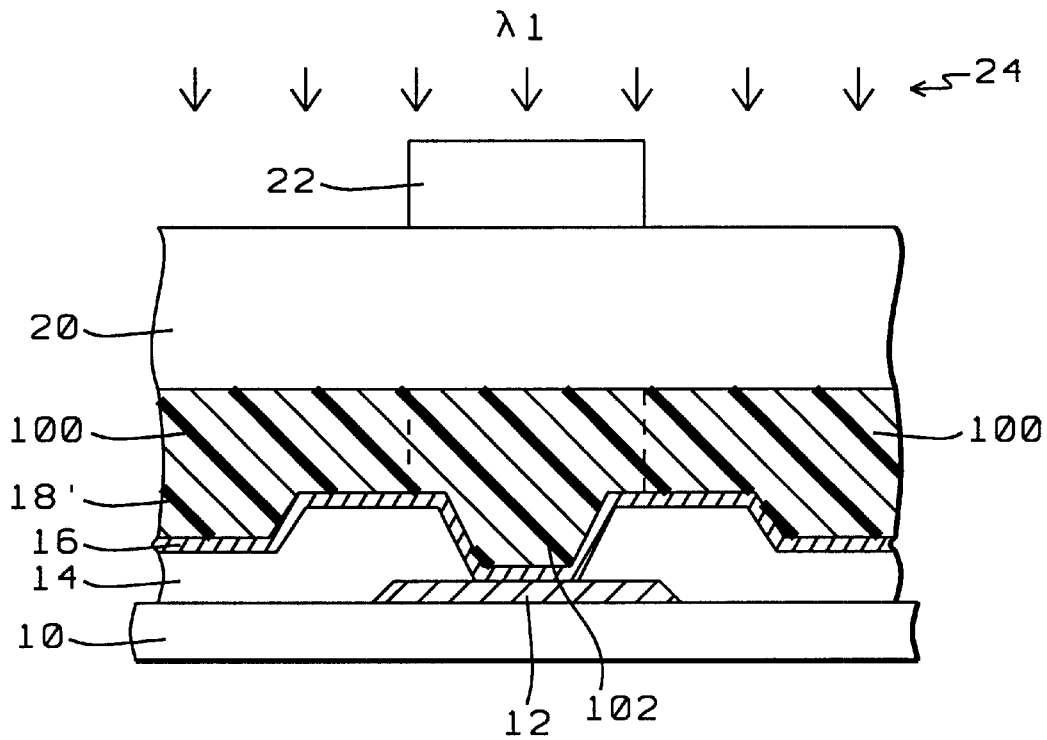

In another key step of the invention and as shown in FIG. 3, first patterned mask 22 is formed over second patterning layer 20, masking a central portion 102 of first patterning layer 18. The first patterning layer 18 is then exposed to the first wavelength (λ1) as at 24 which exposes only the unmasked portions 100 of first patterning layer 18 leaving the central portion 102 unexposed. The second patterning layer 20 is substantially unaffected by the exposure of the first wavelength (λ1) of light.

First patterned mask 22 is then removed.

Selective Exposure of Second Patterning Layer 20

Figure 4:
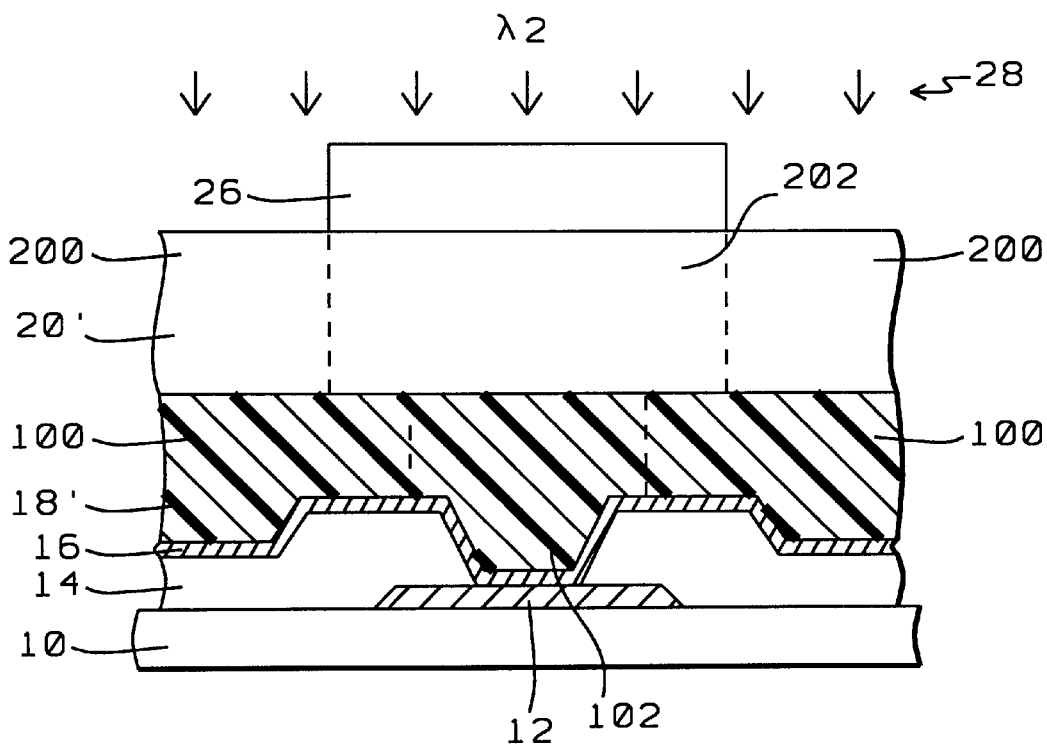

In another key step of the invention and as shown in FIG. 4, second patterned mask 26 is formed over second patterning layer 20, masking a central portion 202 of second patterning layer 20. Central portion 202 of second patterning layer 20 is wider than, and is substantially centered over, the non-exposed central portion 102 of first patterning layer 18.

The second patterning layer 20 is then exposed to the second wavelength (λ2) as at 28 which exposes only the unmasked portions 200 of second patterning layer 20 leaving the central portion 202 unexposed. The first exposed patterning layer 18' is substantially unaffected by the exposure of the second wavelength (λ2) of light.

Second patterned mask 26 is then removed.

Formation of Solder Metal Plug 32

Figure 5:
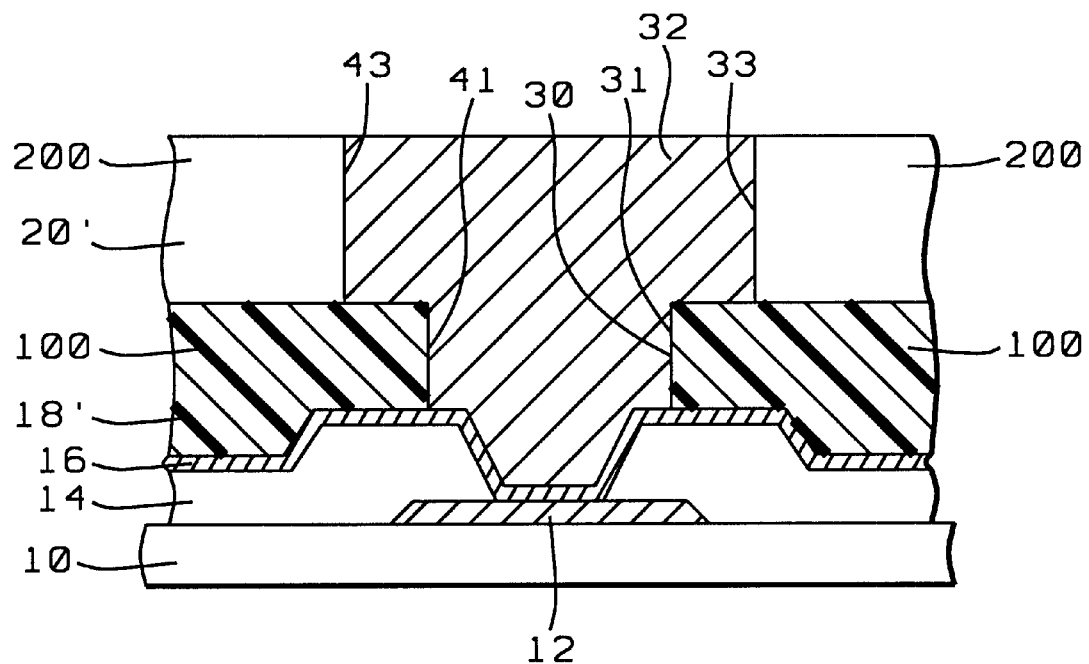

As shown in FIG. 5, the developer is used to remove the unexposed portions 102, 202 of patterning layers 18', 20', respectively, to form a dual straight wall/damascene-type opening 30 within the first and second respectively exposed patterning layers 18', 20'.

Opening 30 includes: a lower opening 31 and an upper opening 33. The specific widths of lower opening 31 and upper opening 33 depend upon the pad size. Lower opening 31 includes substantially straight and vertical walls 41 and upper opening 33 includes substantially straight and vertical walls 43.

A solder metal material is then deposited over the structure, filling opening 30, and the excess of the solder metal material is removed to form a planarized solder metal plug 32. Solder metal plug 32 is preferably formed of tin lead, a lead-free material, SnAg, SnBi, or SiZn and is more preferably formed of PbSn.

A significantly greater amount of solder metal material forms solder metal plug 32 in accordance with the method of the present invention without having to have a wider UBM pad 16' (see below).

Removal of Exposed Portions 100, 200 of First and Second Patterning Layers 18', 20'

Figure 6:
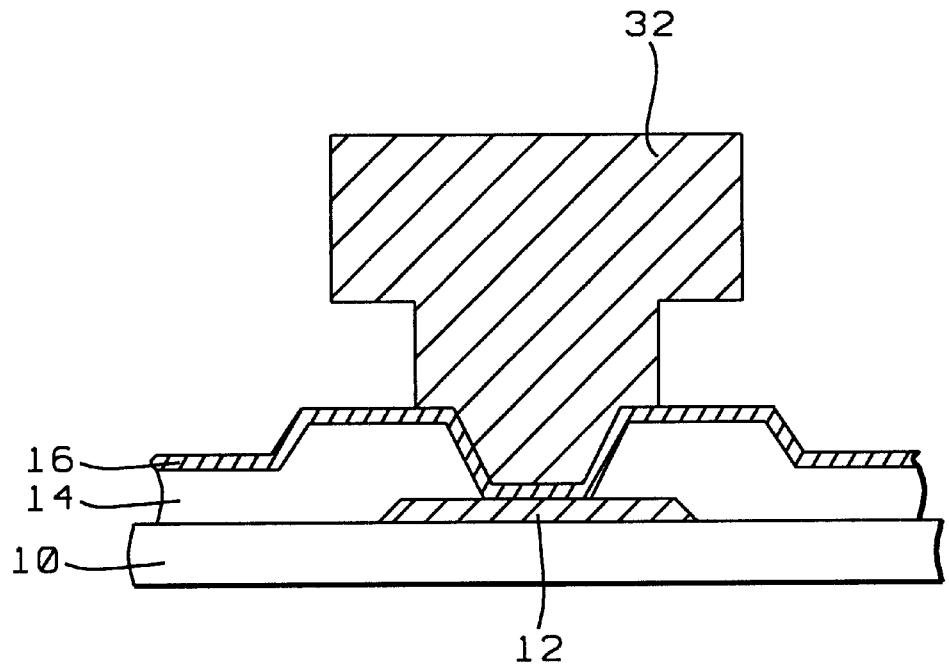

As shown in FIG. 6, the exposed portions 100, 200 of first and second patterning layers 18', 20', respectively, are removed, leaving solder metal plug 32, and a portion of UBM 16, exposed.

Exposed portions 100, 200 are stripped from the structure and may be stripped in a one step stripping process.

Etching of the Exposed Portion of UBM 16

Figure 7:
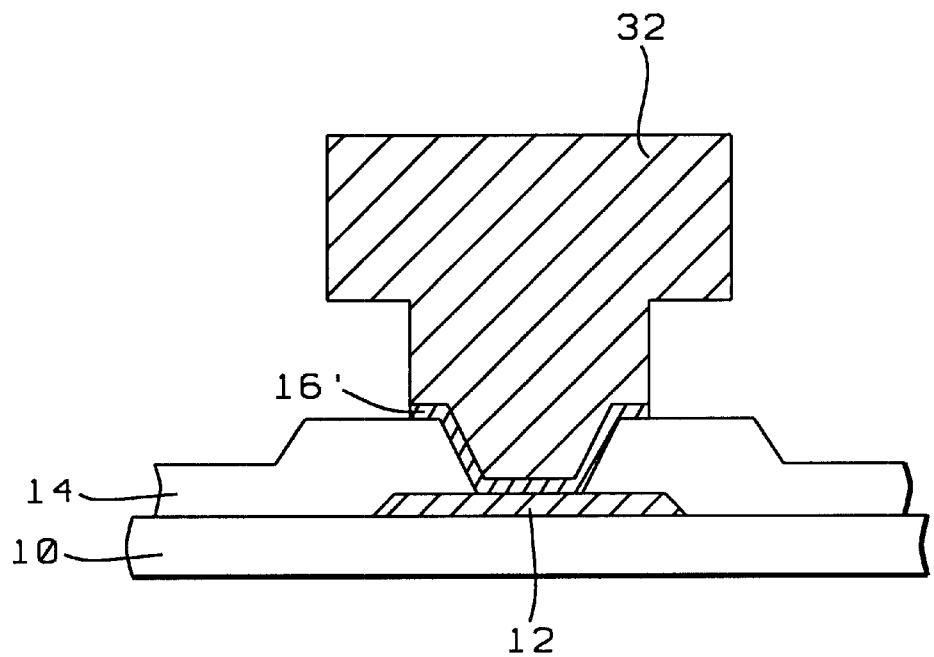

As shown in FIG. 7, the exposed portion of UBM 16 not directly covered by solder metal plug 32 is removed, preferably by etching, to leave UBM pad 16'.

Reflowing of Solder Metal Plug 32

Figure 8:
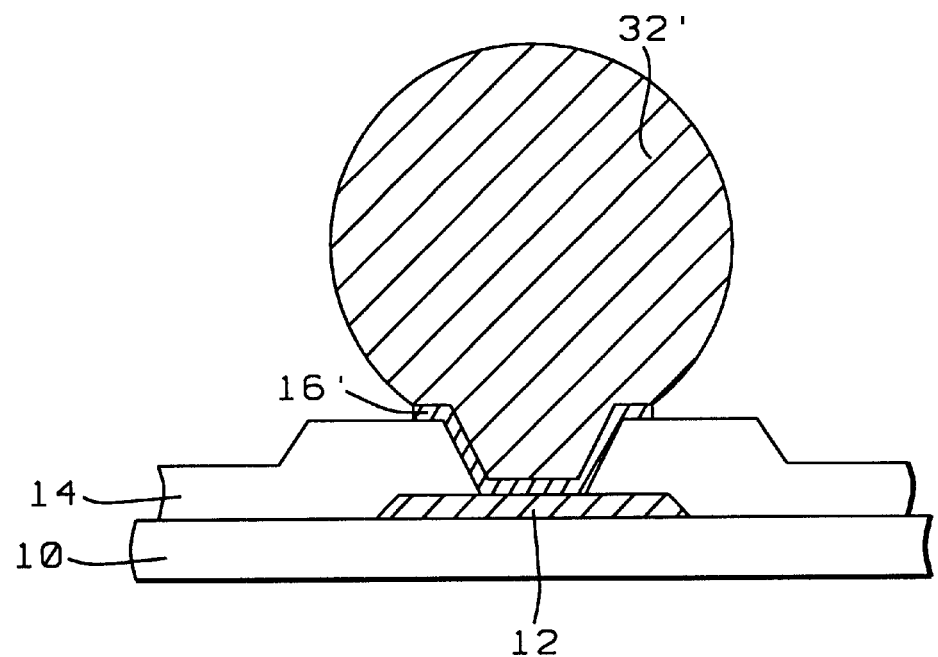

As shown in FIG. 8, solder metal plug 32 is reflowed to form solder bump 32'. Solder bump 32' is significantly taller using the method of the present invention due to the increased amount of solder material forming solder metal plug 32. (see above)

Advantages of the Present Invention

The advantages of one or more embodiments of the present invention include:

1. the bump height is improved (increased) without changing the UBM size (width);
2. one is able to increase the bump height for a small pad design;
3. improved bump height control is achieved;
4. improved reliability of the flip-chip package; and
5. chip cracking is prevented.

While particular embodiments of the present invention have been illustrated and described, it is not intended to limit the invention, except as defined by the following claims.

We claim:

1. A method of fabricating a solder bump, comprising the steps of:

providing a UBM over a substrate having an exposed pad portion; the UBM in electrical contact with the pad portion;

forming a first patterning layer over the UBM; the first patterning layer being comprised of a photosensitive material sensitive to light having a first wavelength;

forming a second patterning layer over the first patterning layer; the second patterning layer being comprised of a photosensitive material sensitive to light having a second wavelength; the second wavelength not being the same as the first wavelength;

selectively exposing the first patterning layer with the light having the first wavelength, leaving a first unexposed portion substantially centered over the pad portion between first exposed portions;

selectively exposing the second patterning layer with the light having the second wavelength, leaving a second unexposed portion wider than, and substantially centered over, the first unexposed portion of the exposed first patterning layer; the second unexposed portion of the exposed second patterning layer being between exposed portions;

removing the second unexposed portion of the exposed second patterning layer and the first unexposed portion of the exposed first patterning layer to form opening;

forming a solder plug within the opening;

removing the exposed portions of the exposed first patterning layer and the exposed portions of the exposed second patterning layer; and reflowing the solder plug to form a solder bump.

2. The method of claim 1, including the step of removing the UBM not under the solder plug before reflowing the solder plug.

3. The method of claim 1, including the steps of:
   forming a passivation layer over the substrate and the pad portion; and
   etching the passivation layer to expose the pad portion.

4. The method of claim 1, wherein the pad portion is formed of a material selected from the group consisting of Cu and AlCu; the passivation layer is formed of a material selected from the group consisting of SiN, $SiO_2$, $SiN/SiO_2$ polyimide and BCB; the UBM is formed of a material selected from the group consisting of Ti/Cu, Cr/Cu, Al/Ni/V and Ti/Ni; the first patterning layer is formed of a material selected from the group consisting of dry film resist, a spin coated photoresist and a negative spin coated photoresist; the second patterning layer is formed of a material selected from the group consisting of negative spin coated photoresist and a negative photosensitive dry film; and the solder plug is formed of a material selected from the group consisting of tin lead, a lead-free material, SnAg, SnBi and SiZn.

5. The method of claim 1, wherein the pad portion is formed of Cu or AlCu; the passivation layer is formed of $SiN/SiO_2$; the UBM is formed of Ti/Cu; the first patterning layer is formed of a negative spin coated photoresist; the second patterning layer is formed of a negative spin coated photoresist; and the solder plug is formed of PbSn.

6. The method of claim 1, wherein the first patterning layer is a photoresist and the second patterning layer is a photoresist or a photosensitive dry film.

7. The method of claim 1, wherein the first and second patterning layers are formed by a spin coating method.

8. The method of claim 1, wherein the opening includes a lower opening within the exposed first patterning layer and an upper opening within the exposed second patterning layer.

9. The method of claim 1, wherein the opening includes a lower opening having substantially vertical walls within the exposed first patterning layer and an upper opening having substantially vertical walls within the exposed second patterning layer.

10. The method of claim 1, wherein the second patterning layer is not substantially affected by exposure to the light having the first wavelength and the first patterning layer is not substantially affected by exposure to the light having the second wavelength.

11. A method of fabricating a solder bump, comprising the steps of:
   providing a UBM over a substrate having an exposed pad portion; the UBM in electrical contact with the pad portion;
   forming a first patterning layer over the UBM; the first patterning layer being comprised of a photosensitive material sensitive to light having a first wavelength;
   forming a second patterning layer over the first patterning layer; the second patterning layer being comprised of a photosensitive material sensitive to light having a second wavelength; the second wavelength not being the same as the first wavelength;
   selectively exposing the first patterning layer with the light having the first wavelength, leaving a first unexposed portion substantially centered over the pad portion between first exposed portions;
   selectively exposing the second patterning layer with the light having the second wavelength, leaving a second unexposed portion wider than, and substantially centered over, the first unexposed portion of the exposed first patterning layer; the second unexposed portion of the exposed second patterning layer being between exposed portions;
   removing the second unexposed portion of the exposed second patterning layer and the first unexposed portion of the exposed first patterning layer to form opening; the opening including a lower opening having substantially vertical walls within the exposed first patterning layer and an upper opening having substantially vertical walls within the exposed second patterning layer;
   forming a solder plug within the opening;
   removing the exposed portions of the exposed first patterning layer and the exposed portions of the exposed second patterning layer; and
   reflowing the solder plug to form a solder bump.

12. The method of claim 11, including the step of removing the UBM not under the solder plug before reflowing the solder plug.

13. The method of claim 11, including the steps of:
   forming a passivation layer over the substrate and the pad portion; and etching the passivation layer to expose the pad portion.

14. The method of claim 11, wherein the pad portion is formed of a material selected from the group consisting of Cu and AlCu; the passivation layer is formed of a material selected from the group consisting of SiN, $SiO_2$, $SiN/SiO_2$ polyimide and BCB; the UBM is formed of a material selected from the group consisting of Ti/Cu, Cr/Cu, Al/Ni/V and Ti/Ni; the first patterning layer is formed of a material selected from the group consisting of dry film resist, a spin coated photoresist and a negative spin coated photoresist; the second patterning layer is formed of a material selected from the group consisting of negative spin coated photoresist and a negative photosensitive dry film; and the solder plug is formed of a material selected from the group consisting of tin lead, a lead-free material, SnAg, SnBi and SiZn.

15. The method of claim 11, wherein the pad portion is formed of Cu or AlCu; the passivation layer is formed of $SiN/SiO_2$; the UBM is formed of Ti/Cu; the first patterning layer is formed of a negative spin coated photoresist; the second patterning layer is formed of a negative spin coated photoresist; and the solder plug is formed of PbSn.

16. The method of claim 11, wherein the first patterning layer is a photoresist and the second patterning layer is a photoresist or a photosensitive dry film.

17. The method of claim 11, wherein the first and second patterning layers are formed by a spin coating method.

18. The method of claim 11, wherein the second patterning layer is not substantially affected by exposure to the light having the first wavelength and the first patterning layer is not substantially affected by exposure to the light having the second wavelength.

19. A method of fabricating a solder bump, comprising the steps of:
   providing a UBM over a substrate having an exposed pad portion; the UBM in electrical contact with the pad portion;
   forming a first patterning layer over the UBM; the first patterning layer being comprised of a photoresist material sensitive to light having a first wavelength;
   forming a second patterning layer over the first patterning layer; the second patterning layer being comprised of a photoresist or a dry film material sensitive to light having a second wavelength; the second wavelength not being the same as the first wavelength;
   selectively exposing the first patterning layer with the light having the first wavelength, leaving a first unexposed portion substantially centered over the pad portion between first exposed portions;

selectively exposing the second patterning layer with the light having the second wavelength, leaving a second unexposed portion wider than, and substantially centered over, the first unexposed portion of the exposed first patterning layer; the second unexposed portion of the exposed second patterning layer being between exposed portions;

removing the second unexposed portion of the exposed second patterning layer and the first unexposed portion of the exposed first patterning layer to form opening; the opening including a lower opening having substantially vertical walls within the exposed first patterning layer and an upper opening having substantially vertical walls within the exposed second patterning layer;

forming a solder plug within the opening;

removing the exposed portions of the exposed first patterning layer and the exposed portions of the exposed second patterning layer;

removing the UBM not under the solder plug before reflowing the solder plug; and reflowing the solder plug to form a solder bump.

20. The method of claim 19, including the steps of:

forming a passivation layer over the substrate and the pad portion; and etching the passivation layer to expose the pad portion.

21. The method of claim 19, wherein the pad portion is formed of a material selected from the group consisting of Cu and AlCu; the passivation layer is formed of a material selected from the group consisting of SiN, SiO$_2$, SiN/SiO$_2$ polyimide and BCB; the UBM is formed of a material selected from the group consisting of Ti/Cu, Cr/Cu, Al/Ni/V and Ti/Ni; the first patterning layer is formed of a material selected from the group consisting of dry film resist, a spin coated photoresist and a negative spin coated photoresist; the second patterning layer is formed of a material selected from the group consisting of negative spin coated photoresist and a negative photosensitive dry film; and the solder plug is formed of a material selected from the group consisting of tin lead, a lead-free material, SnAg, SnBi and SiZn.

22. The method of claim 19, wherein the pad portion is formed of Cu or AlCu; the passivation layer is formed of SiN/SiO$_2$; the UBM is formed of Ti/Cu; the first patterning layer is formed of a negative spin coated photoresist; the second patterning layer is formed of a negative spin coated photoresist; and the solder plug is formed of PbSn.

23. The method of claim 19, wherein the first and second patterning layers are comprised of spin coated photoresist.

24. The method of claim 19, wherein the second patterning layer is not substantially affected by exposure to the light having the first wavelength and the first patterning layer is not substantially affected by exposure to the light having the second wavelength.

25. The method of claim 19, wherein the pad portion is formed of Cu or AlCu; the passivation layer is formed of SiN/SiO$_2$; the UBM is formed of Ti/Cu; the first patterning layer is formed of a negative spin coated photoresist; the second patterning layer is formed of a negative spin coated photoresist; and the solder plug is formed of PbSn; and wherein the second patterning layer is not substantially affected by exposure to the light having the first wavelength and the first patterning layer is not substantially affected by exposure to the light having the second wavelength.

* * * * *